(12) United States Patent
Malladi et al.

(10) Patent No.: US 7,928,812 B2
(45) Date of Patent: Apr. 19, 2011

(54) AUTOMATED TUNING IN WIDE RANGE MULTI-BAND VCO WITH INTERNAL RESET CONCEPT

(75) Inventors: Anjali R Malladi, Essex Junction, VT (US); Pradeep Thiagarajan, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 92 days.

(21) Appl. No.: 12/477,945

(22) Filed: Jun. 4, 2009

(65) Prior Publication Data

US 2010/0308922 A1 Dec. 9, 2010

(51) Int. Cl.
*H03B 1/00* (2006.01)
(52) U.S. Cl. ............ 331/179; 331/16; 331/34; 327/156; 327/158; 327/159
(58) Field of Classification Search .................. 331/16, 331/179, 34; 327/156, 158, 159
See application file for complete search history.

(56) References Cited

U.S. PATENT DOCUMENTS

| 5,648,744 | A | 7/1997 | Prakash et al. |
| 6,091,304 | A | 7/2000 | Harrer |
| 6,469,584 | B1 * | 10/2002 | Eker et al. ..................... 331/11 |
| 6,806,786 | B1 | 10/2004 | Lam et al. |
| 7,738,618 | B2 * | 6/2010 | Jacobsson et al. ............ 375/375 |
| 2004/0000956 | A1 | 1/2004 | Jaehne et al. |

* cited by examiner

*Primary Examiner* — Arnold Kinkead
(74) *Attorney, Agent, or Firm* — David A. Cain

(57) ABSTRACT

Circuits and methods for automated real-time tuning of wide range frequency/delay voltage controlled oscillators (VCO) using a reset mechanism, to account for run-time variations such as power supply, temperature, reference clock frequency and input slew drift etc is described. It finds extensive applications in wide range, multi frequency band phase and delay locked loops. In one embodiment, an automated Jump-Down band switching structure and method for use in VCOs with a plurality of frequency bands is described. This involves monitoring the VCO's analog control voltage signal until it reaches a predetermined lower limit, at which time band switching to an overlapping lower frequency band is triggered by an internally generated reset signal, while simultaneously charging the analog control voltage to a limit in a pre-determined range of the lower band, to avoid phase detector malfunctions in the PLL/DLL system at lower control voltages during band switch.

16 Claims, 7 Drawing Sheets

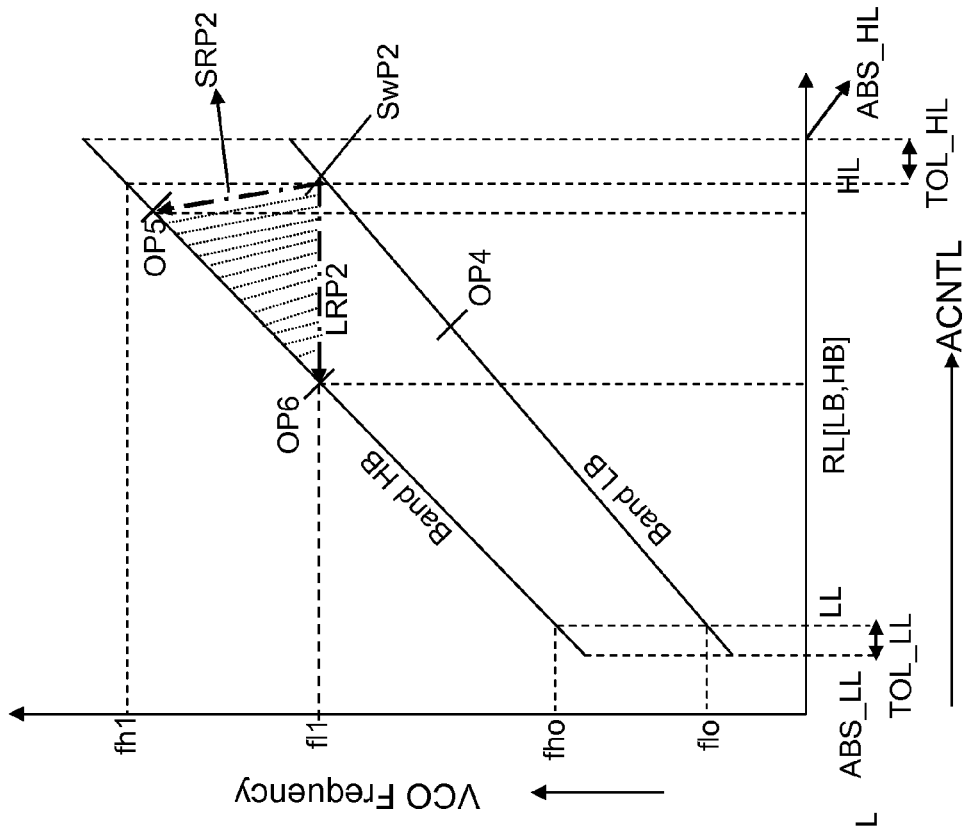
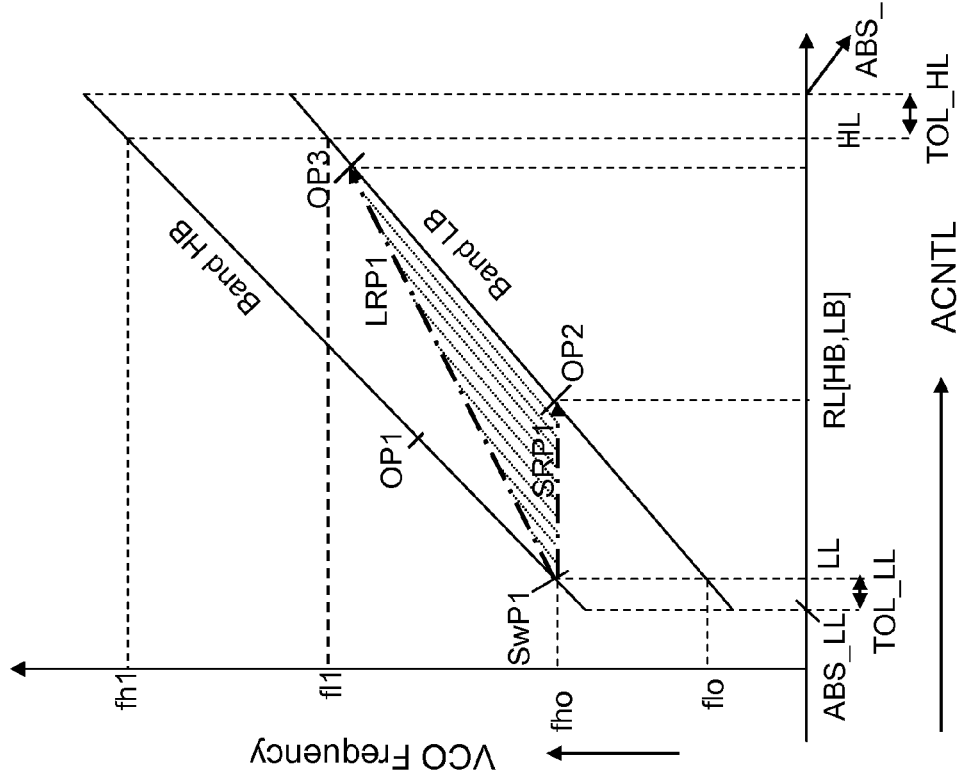

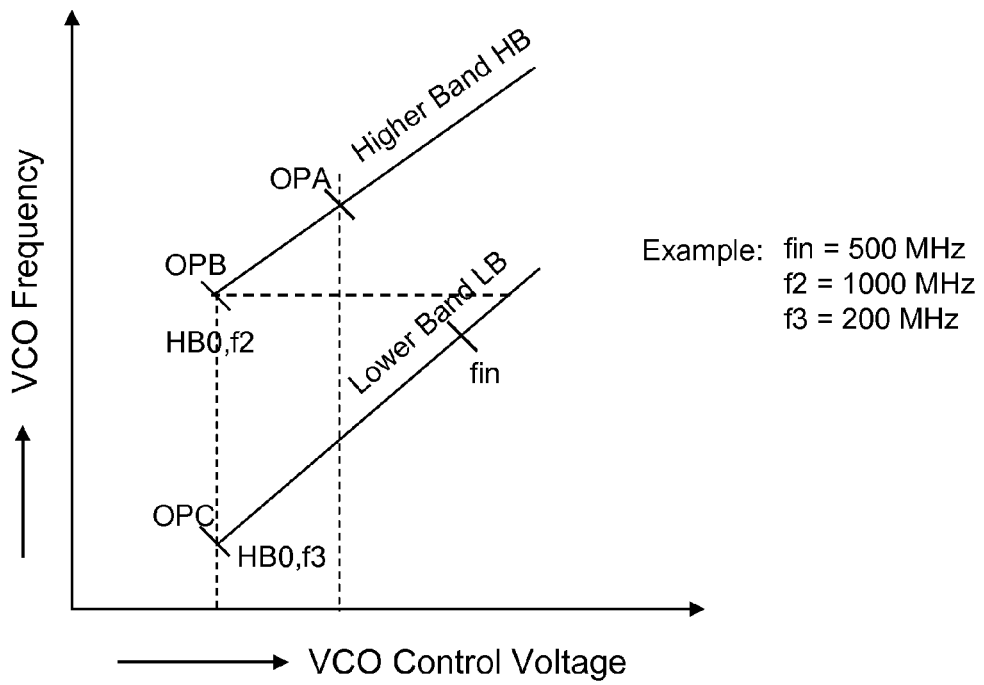
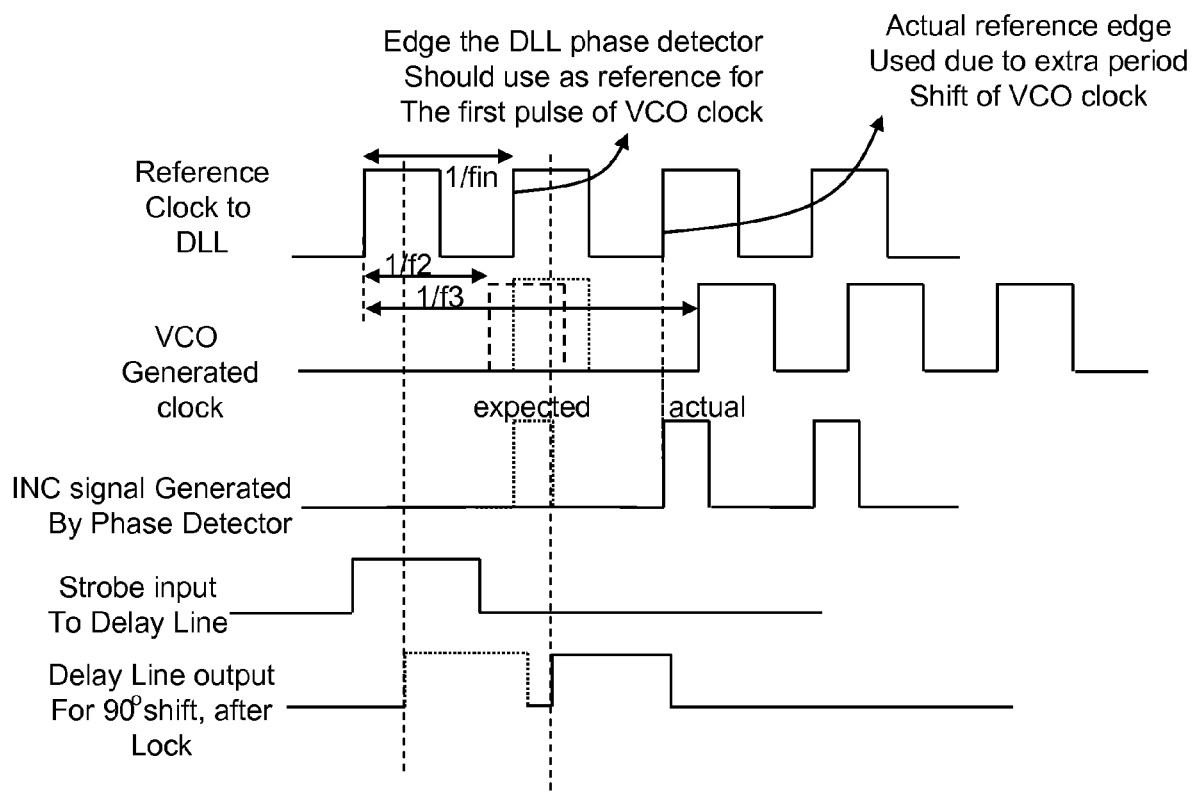
Figure 4

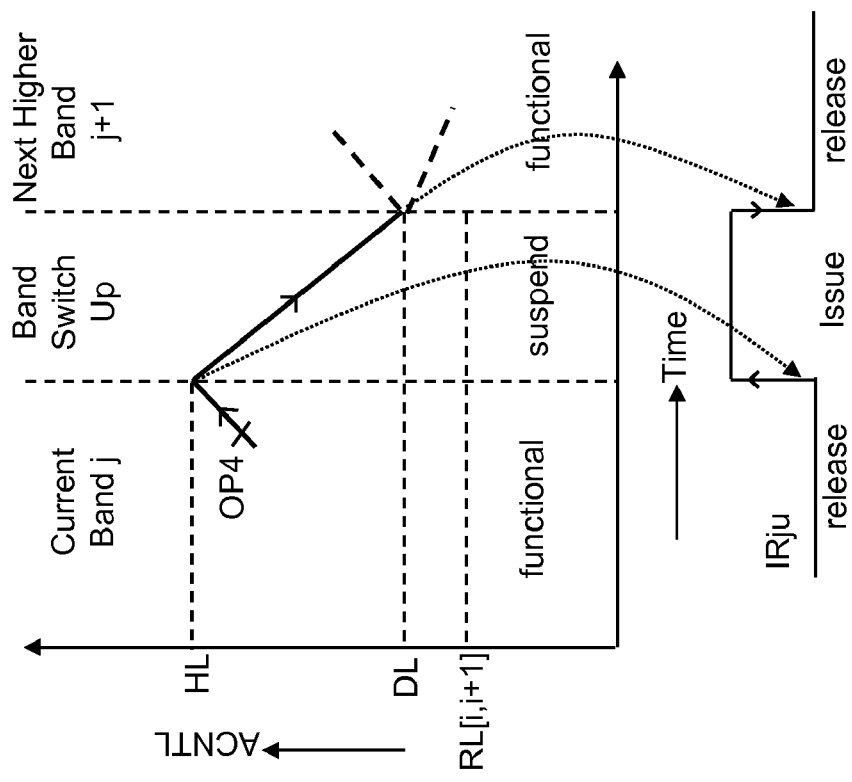
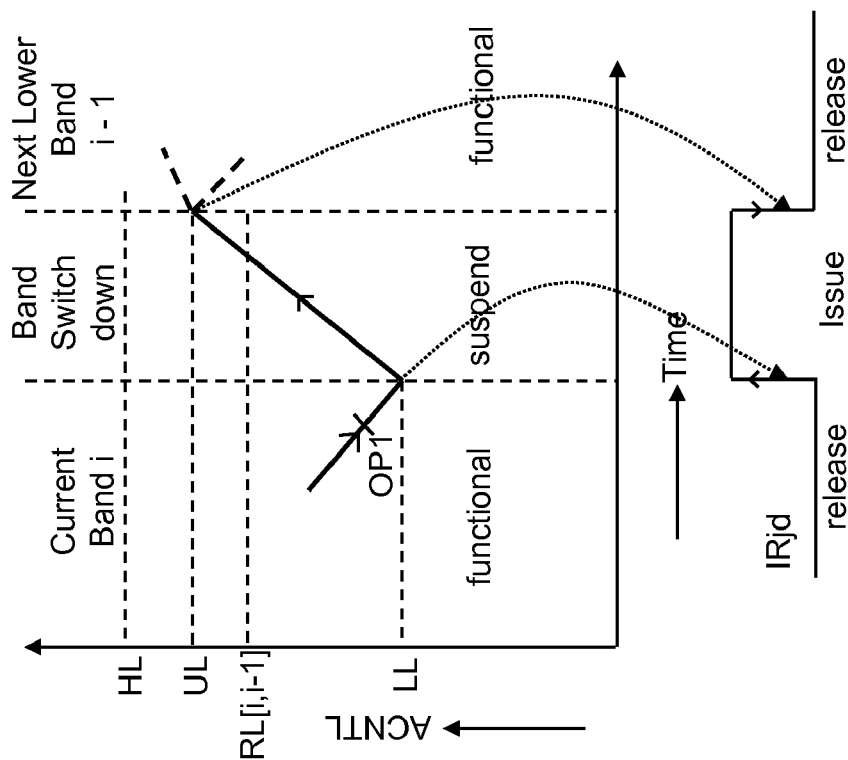
Figure 5

AUTOMATED TUNING IN WIDE RANGE MULTI-BAND VCO WITH INTERNAL RESET CONCEPT

CROSS REFERENCE TO RELATED APPLICATIONS

This U.S. Patent Application is related to U.S. patent application Ser. No. 11/928,093, filed Oct. 30, 2007, titled "DESIGN STRUCTURE FOR AN AUTOMATED REAL-TIME FREQUENCY BAND SELECTION CIRCUIT FOR USE WITH A VOLTAGE CONTROLLED OSCILLATOR", which is a continuation in part of U.S. patent application Ser. No. 11/618,952, Filed Jan. 2, 2007, titled: "AUTOMATED REAL-TIME FREQUENCY BAND SELECTION CIRCUIT FOR USE WITH A VOLTAGE CONTROLLED OSCILLATOR", and assigned to the present Assignee.

FIELD OF THE INVENTION

The present invention generally relates to the field of voltage controlled oscillators. The invention is directed to an automated real-time frequency band selection circuit and method for use with Voltage controlled oscillators that typically find usage in different circuits including Phase Locked Loops and Delay Locked loops.

BACKGROUND OF THE INVENTION

Voltage Controlled Oscillators(VCO) find usage in many circuits including Phase Locked Loop(PLL) and Delay Locked Loop(DLL) systems, where the VCO generates output frequencies depending on an input bias voltage to it. PLLs and DLLs are closed loop systems with feedback that employ voltage controlled elements and methods to generate reference frequencies for the loop to lock. VCOs can be implemented in many different known architectures such as LC tanks, Voltage bias controlled Inverter delay chains etc. Though the PLL is a different architecture than a DLL, they both use an Analog control voltage to control the VCO explained as follows.

In PLLs, based on feedback of how much the phase and/or frequency of a reference input signal is off from a derivative of VCO generated frequency, the VCO's bias voltage automatically moves in a direction so as to gradually increase/decrease the VCO's frequency for the loop to lock. Alternatively, in DLLs, based on feedback of how much the delay (hence phase) of a delayed signal from a reference input signal is off, the bias voltage controlling the delay of the inverters automatically moves in a direction so as to gradually increase/decrease the delay equal to an exact 1 period shift (or 360 degree phase shift). Both the PLLs and DLLs employ a phase detector that compares the reference input signal to the VCO derivative signal/inverter delayed signal generating increment or decrement pulses that in-turn increase or decrease a certain analog control voltage maintained by a charge pump, which is then fed back to the VCO/Delay inverters.

In an integrated circuit, a PLL or DLL circuit can be used to generate internal reference clock signals, their frequency divisions, precise phase shifts of one signal based on the frequency of the other etc. Because of process variations in an integrated circuit, and the Application's temperature and supply voltage variations, a VCO in an integrated circuit may require several frequency bands from which its operating frequency is selected. Consequently, a VCO may be provided that has a fixed set of frequency bands from which to choose at the initial start up of the PLL circuit (e.g., during the power-up sequence). However, when the VCO is operating, power supply voltage variations and temperature variations over time may affect the VCO frequency. For example, if the capacitance of an LC tank VCO changes with temperature or supply voltage or both, or if the Delay of inverter chain VCO changes with temperature or supply voltage or both, the PLL/DLL circuit has no mechanism for automatically adjusting its frequency band during operation and, consequently, the PLL/DLL circuit may lose its lock status and operate inefficiently possibly providing incorrect output frequencies, which is not acceptable.

A frequency band corresponds to a range of VCO output frequencies from a minimum to a maximum that is achieved by sweeping its control voltage in operational limits, covering all possible process, supply voltage and temperature conditions, and other specifications if any. Multiple frequency bands correspond to different bands provided by the same VCO when its architecture/operation is configured differently under the same above mentioned PVT and other specifications range. For continuity in frequencies covered by any two adjacent bands, there should be an overlap of frequencies. Configuring the VCO differently to fall in different bands can be linked to digital tune bits that can be externally controlled. This invention is targeted for automated band switching that involves internal automated real time tune bit transitions to change bands.

Currently known methods for automated band switching mechanisms include: band jumping from a higher band to the next lower band and so on; band jumping from a lower band to the next higher band and so on; intermingled band jumping. All of the art retains the control voltage while the band is switched. A different VCO frequency (or delay) occurs at the new band for each of the same control voltages. This could be a problem in certain situations where the control voltage in the new band is outside that band's operational limit.

One such situation is described in FIG. 4A, which is a graph of VCO frequency vs. VCO control voltage. FIG. 4B shows five problem waveforms. Referring to the graph in FIG. 4A, Let $OP_A$ be the current operating point in higher band HB. Assuming a temperature or voltage supply drift, or lowering of input frequency to PLL/DLL system tends to make $OP_A$ drift lower down the band to $OP_B$. The VCO control voltage is at HB0. If delay $1/f_2$ is not slow enough for a lock in the PLL/DLL system, then the system requires a band switch to a lower frequency band. When a switch from HB to a lower frequency band LB is made from operating point $OP_B$ to $OP_C$, the VCO's control voltage HB0 stays the same while the internal tune bits automatically change. If the delay (inverse of new VCO frequency: $1/f_3$) produced at the new control point is greater than 2× the input clock period $f_{in}$, this causes the phase detector to malfunction by skipping one or more reference edges. This could happen if the frequency range covered by 2 bands is very large. The waveforms in FIG. 4B have voltage (y axis) vs. time (x axis) representation, the first waveform is a reference clock with a frequency $f_{in}$ to the DLL. The second waveform is the VCO generated clock that is the delayed version of first waveform. The aim of the VCO is to shift each pulse of the reference clock by 1 period (360 degree phase shift), eg, $1^{st}$ pulse of reference clock to dotted pulse of VCO clock. So the $2^{nd}$ rising edge of reference clock aligns with the dotted VCO clock pulse's rising edge for DLL to lock. The dashed-line pulse shown represents operating point $OP_B$ and is the reference's first pulse shifted by delay of $1/f_2$. The solid first pulse of the VCO clock is the reference clock delayed by $1/f_3$, represents the operating point OPc. The third waveform is a phase detector generated increment pulse that goes to the loop-controlling charge pump of the DLL. The solid-lined first increment pulse is an indication to move the first solid pulse of VCO clock towards the $3^{rd}$ rising edge of the reference clock (which is a 720 degree phase shift) and is incorrectly locked. The correct increment pulse would be represented as the dashed pulse. So if a strobe signal is shifted by 90 degrees of reference clock in a locked DLL system, and if waveform 5 indicates the delayed strobe signal, then the dashed strobe signal is the correct output, but the DLL system shifts it incorrectly shown by the solid strobe signal, with an extra 360 degree phase of reference clock.

One embodiment describes methods and structures for the automated tuning of wide range frequency/delay VCOs used in wide range frequency PLLs and wide range delay DLLs, the large range accomplished with the use of multiple frequency or delay tuning bands, the automation utilizing a reset function that is invoked during band switching. This advance in structure is particularly needed in VCOs that have very wide delay tuning ranges using the analog tuning voltage within each individual tuning band. Presence of very large steps between the tuning ranges or bands even after sufficient overlap between the bands is possible. When large band switching steps (or coarse digital tuning) toward larger delays (smaller frequencies) are allowed, it makes possible a hazard of locking to an integer multiple greater than one of the desired delay increment/frequency decrement. The embodiments describe methods and structures to automatically switch bands with appropriate internal reset mechanisms, to a higher or a lower band depending on the current value of the VCO's control voltage, that could have moved and reached the end limit of the current band due to variations including supply voltage/temperature drifts or reference input frequency changes to the PLL/DLL system over time.

SUMMARY OF THE INVENTION

A structure of an automated band switching mechanism for use in VCOs with a plurality of frequency bands is described. The structure has a Jump-Down bands and a Jump-up bands.

The Jump Down structure takes the VCO's analog control voltage that adjusts the frequency within a chosen frequency band as input. The band switching is from a higher band to an overlapping lower band, if the analog control voltage has reached a lower operational limit in that band and is still not at the desired stable operation point, hence requiring a downward band shift. The structure comprises a monitoring circuitry configured to automatically monitor the analog control signal to preset limits and generate intermediate digital monitor control signals; an internal reset generation circuitry using the intermediate digital monitor control signals and issues a digital reset control signal signifying band switch and suspend the operation of the VCO until the analog control voltage is reset to a value in a predetermined range; a band selection circuit for automatically generating appropriate band selection tuning signal(s), as a function of the internal reset and current tuning values, the tuning bits combinations distinguishing one band from another; and charge up circuitry to raise the analog control voltage to a value in a pre-determined range for the next lower frequency band.

The Jump-up structure takes the VCO's analog control voltage as input. The band switches from a lower band to a higher band if the analog control voltage has reached a higher operational limit in the lower band and is still not at the desired stable operating point, thereby requiring an upward band shift. The structure comprises monitoring circuitry configured to automatically monitor the analog control signal to preset limits and generate intermediate digital monitor control signals; internal reset generation circuitry using the intermediate digital monitor control signals and issues a digital reset control signal signifying band switch and suspend the operation of the VCO until the analog control voltage is reset to a value in a predetermined range; a band selection circuit for automatically generating appropriate band selection tuning signal(s), as a function of the internal reset and current tuning values, the tuning bits combinations distinguishing one band from another; and charge down circuitry to lower the analog control voltage to a value in a pre-determined range for the next higher frequency band.

A Method of automated tuning is also provided. The method automatically monitors, selects and switches to a different frequency band from the current frequency band, among a plurality of bands during functional operation of a VCO system, depending on a variety of constraints. It comprises both Jump-down band and Jump-up band methods.

The jump-down method involves selecting a lower frequency band from higher frequency band in a multi-band VCO. This method includes a monitor procedure to monitor and compare an analog control voltage signal received from a VCO relative to a low pre-determined limit; a reset issue procedure to detect when the analog control voltage reaches its predetermined functional limit and issues an internal reset to suspend the VCO's operation while setting the analog control voltage to a value in a predetermined operable range for the next lower band; a band selection procedure for generating a band selection signal to select the next lower band; and a reset release procedure to put the VCO back in functional mode in the newly selected frequency band.

The jump-up method includes selecting a higher frequency band from lower frequency band in a multi-band VCO. This method includes a monitor procedure to monitor and compare an analog control voltage signal received from a VCO relative to a high pre-determined limit; a reset issue procedure to detect when the analog control voltage reaches its predetermined limit and issues an internal reset to suspend the VCO's operation while setting the analog control voltage to a value in a predetermined operable range for the next higher band; a band selection procedure for generating a band selection signal to select the next higher band; and a reset release procedure to put the VCO back in functional mode in the newly selected frequency band.

BRIEF DESCRIPTION OF DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 2b is a graph illustrating the Jump-up band switching from a lower band to a higher band FIG. 4 illustrates the a potential problem overcome by the invention FIG. 5 shows a plot of internal reset signal generation, during band switching

DETAILED DESCRIPTION

Figure 1A:
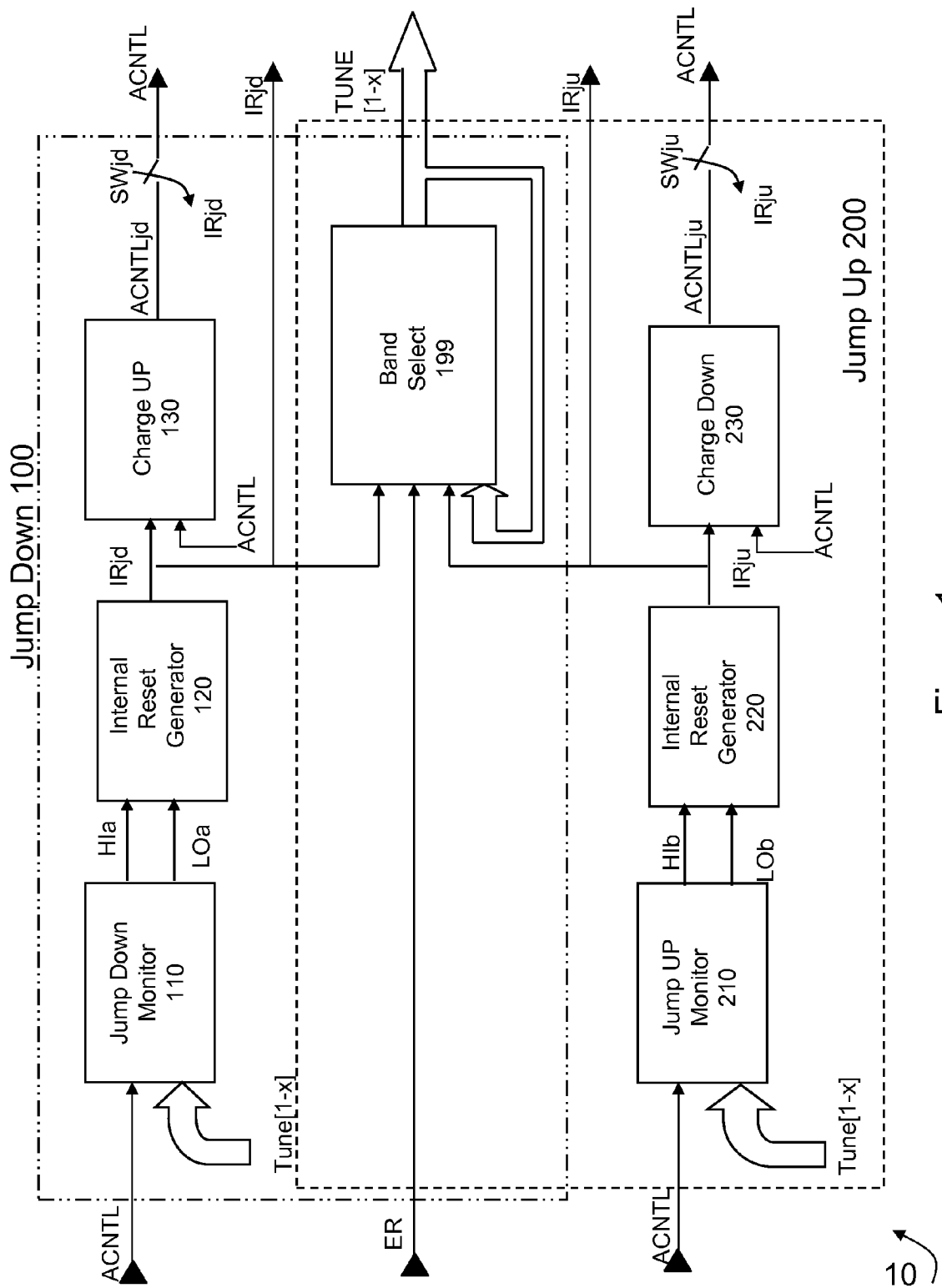
FIG. 1a illustrates a high level block diagram of the automated tuning structure for band switching with internal reset, consisting of Jump-down and Jump-up structures

A VCO has N frequency bands, with N being the highest frequency band, with adjoining bands having some frequency overlap. For selection each of the N bands, x tune bits are required where $N<=2^x$. Referring FIGS. 2a and 2b, Let HB and LB be the higher and lower frequency bands of the VCO designed. Let ABS_LL and ABS_HL be the absolute lowest and highest operating value for the analog control voltage ACNTL to the VCO. These values depend on the architecture of the circuit (eg. Charge pump) that generates the control voltage, in the application the VCO is used in and is determine by how high and how low that circuit can go till, assuming a VCO system that puts out the highest frequency for a high control voltage. Extra tolerance can be built around each ABS_LL and ABS_HL value. So LL is functional low limit (ABS_LL+tolerance) at which band switch to lower band is triggered and HL is functional high limit (ABS_HL−tolerance) at which band switch to higher band is triggered. Let HB's frequency range be from fh0 to fh1, fh1 being the higher frequency corresponding to HL and fh0 being the lower frequency corresponding to LL. Let LB's frequency range be from fl0 to fl1, fl1 being the higher frequency corresponding to HL and fl0 being the lower frequency corresponding to LL. The bands overlap for continuity between fh0 and fl1.

For given two overlapping bands a and b: If a is the higher band, then value RL[a,b] (reset limit) is recorded as that value of ACNTL, whose band b frequency corresponds to that band a frequency at control voltage LL. corresponding to frequency at LL of band a. For a>b, the value UL is chosen as $RL[a,b]<=UL<HL$. If a is the lower band, then value RL[a,b] is recorded as that value of ACNTL, whose band a frequency corresponds to that band b frequency at control voltage HL. All combinations of overlapping bands are formed in a 2 dimensional matrix of RL[a,b]. Thus for given 2 bands a and b, For a<b, The value DL is chosen as $RL[a,b]<=DL<HL$.

FIG. 2a is a graph illustrating the Jump-down band switching method from a higher band to an overlapping lower band with the reset concept. Let us assume that the VCO system is currently running stable condition in band HB at point OP1 for a PLL/DLL system. Now if Temperature, supply voltage or other specifications to the VCO system drifts, or if the input frequency to the PLL/DLL changes so as to move OP1 lower in the band in order to maintain lock in the PLL/DLL system, this will require a band jump to a lower band LB once OP1 reaches switching SwP1. During Band switch from HB to LB, an internal reset signal can be issued that puts the VCO, PLL/DLL system is in suspended mode. The analog control voltage is then re-assigned a new starting value for the new band, and then the functional operation resumes after ACNTL is reset. This primarily overcomes situation described in paragraph [0008]. The new assigned value is chosen from a range of UL, between RL[HB,LB] and HL. If UL is chosen as RL[HB,LB], then Short Reset path(SRP1) is chosen to reassign ACNTL to operating point OP2 in the lower band LB after which the internal reset signal is released and the VCO system is in functional mode. If UL is chosen as just less than HL, then Long Reset path(LRP1) is chosen to reassign ACNTL to operating point OP3 in the lower band LB after which the internal reset signal is released and the VCO system is in functional mode. The shaded area represents the range in which the reset paths can be chosen. Once in functional mode, the operating point is free to move upwards or downwards within the lower band looking for lock in the PLL/DLL system.

Thus corresponding to the new higher starting value of ACNTL in the lower band, the starting delay (frequency inverse) in the lower band will not be more than twice the delay (frequency inverse) that was achieved in the higher band. The starting delay thus matches or is less than the slowest delay in the higher band. This new approach allows the delay ratio in adjacent delay bands to be larger and therefore can enable simpler designs with fewer bands to cover very large tuning ratios (maximum delay to minimum delay ratio).

FIG. 2b is a graph illustrating the Jump-up band switching method from a lower band to an overlapping higher band with the reset concept. Let us assume that the VCO system is currently running stable condition in band LB at point OP4 for a PLL/DLL system. Now if Temperature, supply voltage or other specifications to the VCO system drifts, or if the input frequency to the PLL/DLL changes so as to move OP4 higher in the band in order to maintain lock in the PLL/DLL system, this will require a band jump to a higher band HB once OP4 reaches switching SwP2. During Band switch from LB to HB, an internal reset signal can be issued that puts the VCO, PLL/DLL system is in suspended mode. The analog control voltage is then re-assigned a new starting value for the new band, and then the functional operation resumes after ACNTL is reset. The new assigned value is chosen from a range of DL, between RL[LB,HB] and HL. If DL is chosen as RL[LB,HB], then Long Reset path(LRP2) is chosen to reassign ACNTL to operating point OP6 in the higher band HB after which the internal reset signal is released and the VCO system is in functional mode. If DL is chosen as just less than HL, then Short Reset path(SRP2) is chosen to reassign ACNTL to operating point OP5 in the higher band HB after which the internal reset signal is released and the VCO system is in functional mode. The shaded area represents the range in which the reset paths can be chosen. Once in functional mode, the operating point is free to move upwards or downwards within the higher band looking for lock in the PLL/DLL system. For the jump-up procedure, the two bands need not necessarily be overlapping in which case DL's range is between LL to HL.

Figure 3:
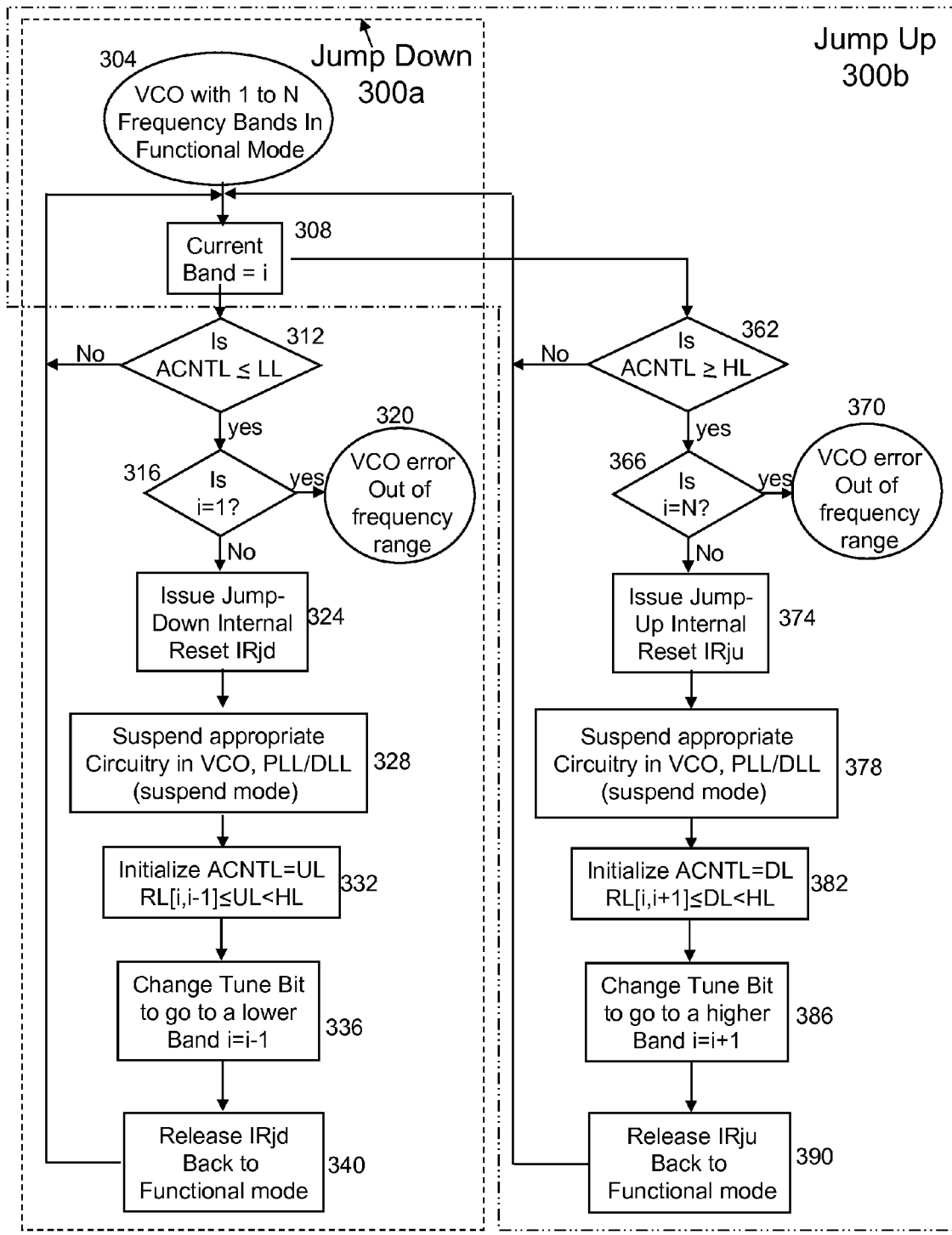
FIG. 3 is a flowchart illustrating the method for automated band switching using reset mechanism graphed in FIGS. 2a and 2b

FIG. 3 is a flowchart illustrating the method 300 for automated band switching using reset mechanism graphed in FIGS. 2a and 2b. Though this flowchart incorporates Jump-up method 300a and Jump-down method 300b combined, the flows of the Jump-up and Jump -down can also be independently in a VCO system. In a PLL/DLL system utilizing a VCO with N frequency bands, a flow described in FIG. 2b can be used where band switching happens in a linear fashion from the highest frequency band to the next highest band during band jump-down, and where band switching happens in a linear fashion from the lowest frequency band to the next highest frequency band during band jump-up, until the PLL reaches lock in a stable operating point in one of the bands. The flow takes into account operating point drifts in a band due to temperature, supply voltage and/or other input variations.

Jump-down flow 300a: A VCO system with 1 to N frequency bands in increasing order operating in functional mode is the start of the sequence (step 304). The current frequency band is defined as i (step 308). A monitor procedure (step 312) keeps track of the control voltage ACNTL. If ACNTL reaches the operating lowest value LL for a given band i, then (YES; step 316) a switch to the next lower band could be initiated, else (NO; step 308). (Step 316)If the current band is already the lowest, then (YES; step 320) frequency range covered by the bands is not enough and error can be reported with the operating point either continuing to stay at LL or issuing a PLL/DLL system stop. If not (No; step 324), a reset issue procedure issues an internal reset signal IRjd. IRjd is then used to suspend appropriate circuitry in the VCO and/or PLL/DLL system (step 328). It then initializes (step 332) the ACNTL to an operational value for the next lower band, that value being UL that is between RL[i,i−1] and HL. A band selection procedure (step 336) changes the tune bits to set appropriate circuitry in the VCO and/or PLL/DLL system to select operation in the next lower frequency band i−1. A reset release procedure (step 340) then releases the internal reset signal IRjd, and the VCo and/or PLL/DLL system is in functional mode going back to step 308. This flow is a continuous real-time flow in the VCO's operation.

Jump-up flow 300b: A VCO system with 1 to N frequency bands in increasing order operating in functional mode is the start of the sequence (step 304). The current frequency band is defined as i (step 308). A monitor procedure (step 362) keeps track of the control voltage ACNTL. If ACNTL reaches the operating highest value HL for a given band i, the (YES; step 366) a switch to the next higher band could be initiated, else (NO; step 308). (Step 366)If the current band is already the highest, then (YES; step 370) frequency range covered by the bands is not enough and error can be reported with the operating point either continuing to stay at HL or issuing a PLL/DLL system stop. If not (No; step 374), a reset issue procedure issues an internal reset signal IRju. IRju is then used to suspend appropriate circuitry in the VCO and/or PLL/DLL system (step 378). It then initializes (step 382) the ACNTL to an operational value for the next higher band, that value being DL that is between RL[i,i+1] and HL. A band selection procedure (step 386) changes the tune bits to set appropriate circuitry in the VCO and/or PLL/DLL system to select operation in the next higher frequency band i+1. A reset release procedure (step 390) then releases the internal reset signal IRju, and the VCO and/or PLL/DLL system is in functional mode going back to step 308. This flow is a continuous real-time flow in the VCO's operation.

Both the Jump-down and Jump-up mechanisms can be used in tandem to make it an automated tuning system for bi-direction band switching. To generalize, the Jump-down method and the Jump-up methods described can be applied for any given two bands, not necessarily adjacent to each other among a plurality of bands.

FIG. 1a illustrates a high level block diagram of the automated tuning structure 10 for band switching with internal reset, consisting of Jump-down structure 100 and Jump-up structure 200. Inputs to structure 10 are VCO's control voltage ACNTL, External Reset ER which is a digital signal. Outputs to structure 10 are ACNTL (fed back to input), Tune bits TUNE[1 to x] which are digital signals, Internal reset signals IRjd and IRju which are digital signals.

The Jump-down structure 100 consists of a Jump down Monitor circuit 110, Internal Reset generation circuit 120, a Charge-up circuit 130, a Band selection circuit 199, and a switch SWjd. Circuit 110 takes the VCO's analog control voltage ACNTL as an input, and outputs HIa and LOa that are edge-triggered pulses based on events happening inside circuit 110. Circuit 110 also takes band selecting tune bits TUNE [1-X] as input, which is used to compute different limits used by the monitor circuit 110. Internal Reset Generation Circuit 110 takes HIa and LOa as inputs, and puts out a digital signal called Internal reset IRjd whose On -time (or Off-time if logic is reversed) is a function of HIa and LOa. IRjd is could be asynchronous or asynchronous to the VCO's frequency based on an optional synchoronous structure inside 120. Band Select Circuit 199 is a state machine circuit that takes ER, IRjd, IRju and TUNE[1 to x] as inputs and outputs new tune bits TUNE[1 to x] that is fed back in. x signals are needed if at least N<=2^x frequency bands are present. Outputs of Jump-Down Circuit 100 are ACNTL and TUNE[1 to x] signals that go to the VCO for changing bands, IRjd that go to the VCO and other PLL/DLL related circuitry to trigger band switching. Charge-up circuit 130 takes IRjd and ACNTL as input and outputs an analog signal ACNTLjd. Switch SWjd takes ACNTLjd as input and is controlled by another input IRjd such that if the reset is issued then the switch is closed and ACNTLjd is propagated as output to ACNTL, else the switch is open.

The Jump-up structure 200 consists of a Jump up Monitor circuit 210, Internal Reset generation circuit 220, a Charge-down circuit 230, a Band selection circuit 199, and a switch SWju. Circuit 210 takes the VCO's analog control voltage ACNTL as an input, and outputs HIb and LOb that are edge-triggered pulses based on events happening inside circuit 210. Circuit 210 also takes band selecting tune bits TUNE[1-X] as input, which is used to compute different limits used by the monitor circuit 210. Internal Reset Generation Circuit 210 takes HIb and LOb as inputs, and puts out a digital signal called Internal reset IRju whose On -time (or Off-time if logic is reversed) is a function of HIb and LOb. ITRju is synchronous or asynchronous to the VCO's frequency based on an optional synchronous structure inside 220. Band Select Circuit 199 is a state machine circuit that takes ER, IRjd, IRju and TUNE[1 to x] as inputs and outputs new tune bits TUNE[1 to x] that is fed back in. x signals are needed if at least N<=2^x frequency bands are present. Outputs of Jump-up Circuit 200 are ACNTL and TUNE[1 to x] signals that go to the VCO for changing bands, IRju that go to the VCO and other PLL/DLL related circuitry to trigger band switching. Charge-down circuit 230 takes IRju and ACNTL as input and outputs an analog signal ACNTLju. Switch SWju takes ACNTLju as input and is controlled by another input IRju such that if the reset is issued then the switch is closed and ACNTLju is propagated as output to ACNTL, else the switch is open.

Figure 1B:
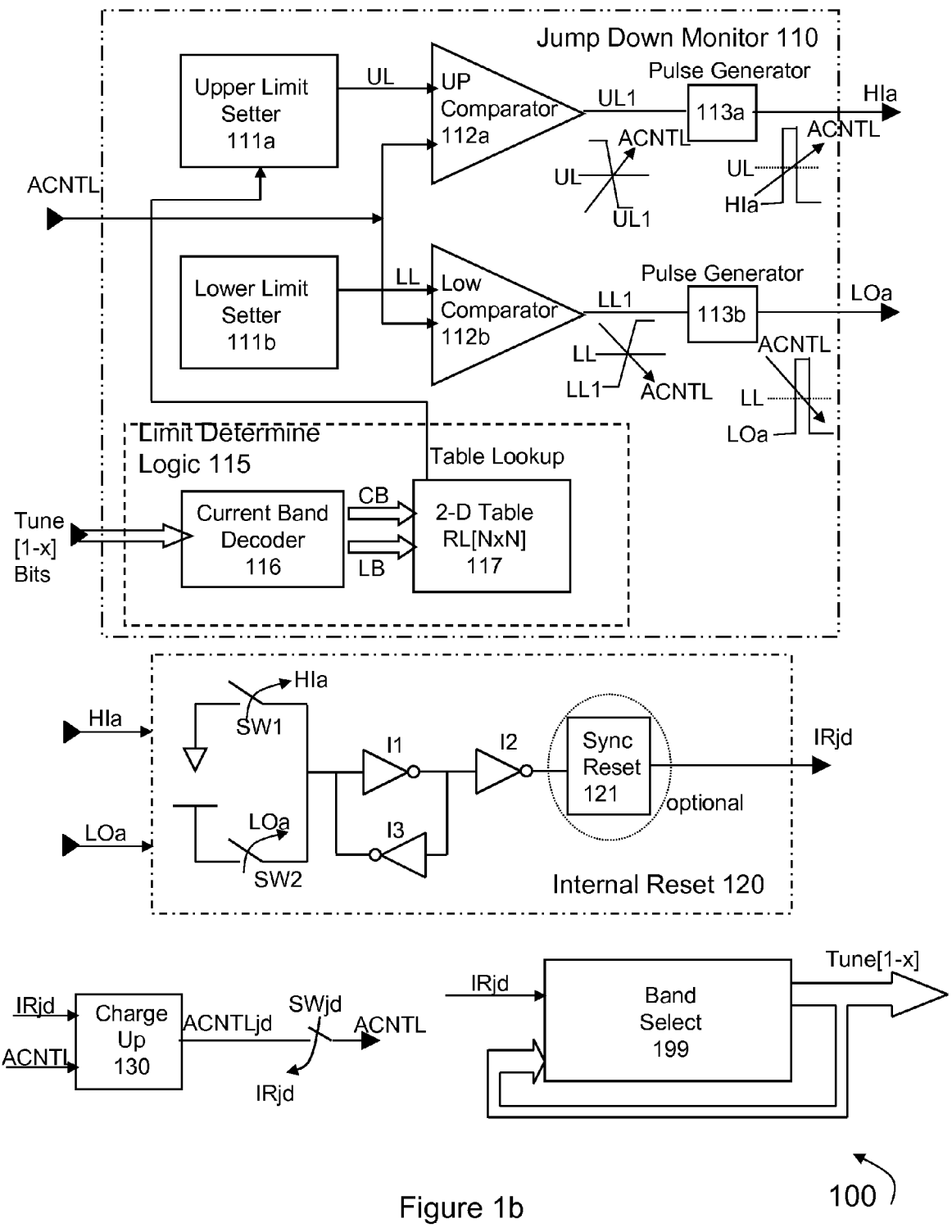
FIG. 1b illustrates a detailed block diagram of the Jump-Down structure of FIG. 1a FIG. 1c illustrates a detailed block diagram of the Jump-Up structure of FIG. 1a FIG. 2a is a graph illustrating the Jump-down band switching from a higher band to a lower band with the reset concept

FIG. 1b illustrates a detailed block diagram of the Jump-Down circuit 100 of FIG. 1a. Jump-down monitor circuit 110 consists of an Upper Limit setter circuit 111a, Lower Limit setter circuit 111b, Upper Comparator 112a, Lower Comparator 112b, Edge -triggered Pulse generator 113a and 113b and Limit determiner logic 115. 111a and 111b are required to output analog signal levels with values UL and LL that are used as references for 112a and 112b. A typical implementation of Limit setters 111a and 111b can be done using voltage divider structures that divide down a regulated supply value to provide analog values, among other known ways to provide a voltage reference value. Typically resistor dividers that could appropriately voltage controlled to provide a variable value could be used. Limit Determiner logic 115 takes Tune[1 to x] bits as input, and inturn consists of a Current band decoder 116 and a Lookup table 117. The Current band decoder 116 can use a typical decoder structure to uniquely identify the current band off the list of 1 to N bands, using the unique Tune bit setting, and output signals identifying the current band (CB) and next lower band (LB). This can then be used to look up on the pre-determined lookup 2-D RL table, based on VCO frequency band design results as described in para[0018]. The result of this lookup can then be appropriately coupled to the 111a circuit that should then output a voltage reference output of UL. Circuit 111b always puts out a voltage reference value of LL. Low comparator 112b compares the current ACNTL value to reference LL and outputs a digital value LL1 when ACNTL goes equal or below LL from a higher value. This event is then recognized by edge-triggered pulse generator 113b implemented by standard latching techniques, that generates a one-shotted pulse signifying issuance of a reset signal IRjd to suspend VCO operation and start band switch to a lower band. 113b should be designed such that the width of the pulse at LOa should be just as small to turn switch SW2 on, then propagate the logic 1 to inverter I1, and then propagate a 0 to I2 input. Up comparator 112a compares the current ACNTL value to reference UL and outputs a digital signal UL1 when ACNTL equals or goes beyond UL from a lower value. This event is then recognized by edge-triggered pulse generator 113a implemented by standard latching techniques, that generates a one-shotted pulse signifying completion of band switch to a lower band, reset of ACNTL value, and the release of reset signal IRjd to resume VCO operation. 113a should be designed such that the width of the pulse at HIa should be just as small to turn switch SW1 on, then propagate the logic 0 to inverter I1's input, and then propagate a logic1 to I2's input. 112a and 112b can typically be implemented using known arts of Differential amplifier structures. In general, any pre-available comparator circuit for 112a and 112b can be used. It typically can be implemented using known arts of Differential amplifier structures.

Internal Reset circuit 120's purpose is to provide an internal reset signal IRjd based on pulses at LOa and HIa. The block is designed such that reset IRjd is issued, when the LOa pulse occurs, and stays issued until the HIa pulse occurs during when it is released. One such implementation is described below: Internal reset generation circuit 120 comprises of switch SW1, switch SW2, Inverters I1, I2 and I3, an optional synchronous reset circuit 121. Inverter I1's output connects to Inverter I2 and I3's input. I3 is a weak inverter to feed back to its output back to I1 to hold steady I1's input if SW1 and SW2 are open. SW2's one end connects to a high potential source such as supply to signify logic 1, and the other end connects to input of inverter I1. LOa described in above paragraph to signify reset issue, controls and turns SW2 on for the duration of the one-shotted pulse LOa. SW1's one end connects to a low potential source such as ground to signify logic 0, and the other end is tied to input of inverter I1. HIa described in above paragraph to signify reset release, controls and turns SW1 on for the duration of the one-shotted pulse HIa. Inverter I2's output goes as input to Synchronous Reset circuit 121 that in turn outputs digital reset signal IRjd. This is an optional circuit, implemented with standard latching techniques that can be used if the application of the VCO in a PLL/DLL system requires the reset signal to the different blocks in the PLL/DLL system to be synchronous with respect to a reference clock. Thus when LOa is triggered, the IRjd goes logic 1, and when HIa is triggered, IRjd goes logic 01. To generalize, the polarities can be reversed if the potentials at the ends of switches are reversed.

Charge-up circuit 130 takes IRjd and ACNTL as inputs and outputs analog signal ACNTLjd. When IRjd is issued, the value of ACNTLjd (initially having the same value as ACNTL) is made to rise over time until IRjd is released. It can typically be implemented with known structures of charge pumps, with the use of capacitors to retain the charged value. Switch SWjd connects ACNTLjd to the output that goes as ACNTL. IRjd controls the switch such that when it is issued, then the switch is closed, else it is open.

Band-select circuit 199 takes inputs IRjd and TUNE[1 to x] bits, and outputs TUNE[1 to x]. Assuming a sequential table of frequency bands, and their Tune bit settings, Circuit 199 is a state machine controller, that is implemented such that when reset IRjd is issued, the tune bits are changed so as to select the Tune bits[1 to x] corresponding to the next lower band.

Figure 1C:
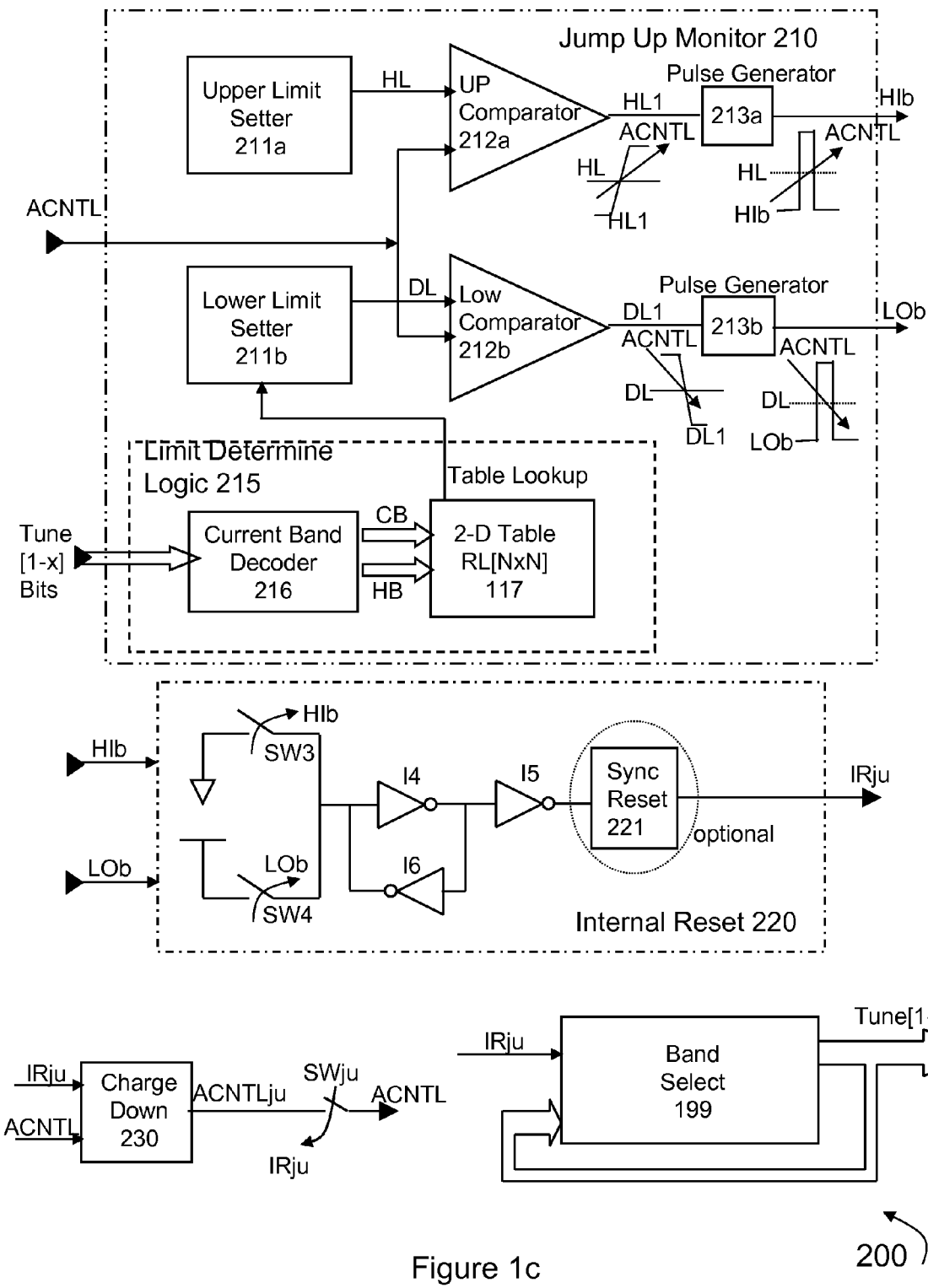

FIG. 1c illustrates a detailed block diagram of the Jump-Up circuit 200 of FIG. 1a. Jump-up monitor circuit 210 consists of an Upper Limit setter circuit 211a, Lower Limit setter circuit 211b, Upper Comparator 212a, Lower Comparator 212b, Edge-triggered Pulse generator 213a and 213b and Limit determiner logic 215. 211a and 211b are required to output analog signal levels with values HL and DL that are used as references for 212a and 212b. A typical implementation of Limit setters 211a and 211b can be done using voltage divider structures that divide down a regulated supply value to provide analog values, among other known ways to provide a voltage reference value. Typically resistor dividers that could appropriately voltage controlled to provide a variable value could be used. Limit Determiner logic 215 takes TUNE[1 to x] bits as input, and in turn consists of a Current-band decoder 216 and a Lookup table 217. This table is the same as Lookup table 117. The Current-band decoder 216 can use a typical decoder structure to uniquely identify the current band off the list of 1 to N bands, using the unique Tune bit setting, and output signals identifying the current band (CB) and next higher band (HB). This can then be used to look up on the pre-determined lookup 2-D RL table, based on VCO frequency band design results as described in para[0018]. The result of this lookup can then be appropriately coupled to the 211b circuit that should then output a voltage reference output of DL. Circuit 211b always puts out a voltage reference value of HL. Upper comparator 212a compares the current ACNTL value to reference HL and outputs a digital value HL1 when ACNTL goes equal or higher than HL from a lower value. This event is then recognized by edge-triggered pulse generator 213a implemented by standard latching techniques, that generates a one-shotted pulse signifying issuance of a reset signal IRju to suspend VCO operation and start band switch to a higher band. 213a should be designed such that the width of the pulse at HIb should be just as small to turn switch SW3 on, then propagate the logic 1 to inverter I4, and then propagate a logic 0 to I5's input. Low comparator 212b compares the current ACNTL value to reference DL and outputs a digital signal DL1 when ACNTL equals or goes lower than DL from a higher value. This event is then recognized by edge-triggered pulse generator 213b implemented by standard latching techniques, that generates a one-shotted pulse signifying completion of band switch to a higher band, ACNTL resetting, and the release of reset signal IRju to resume VCO operation. 213b should be designed such that the width of the pulse at LOb should be just as small to turn switch SW4 on, then propagate the logic 0 to inverter I4, and then propagate a logic 1 to I5's input. In general, any pre-available comparator circuit for 212a and 212b can be used. It typically can be implemented using known arts of Differential amplifier structures.

Internal Reset circuit 220's purpose is to provide an internal reset signal IRju based on pulses at HIb and LOb. The block is designed such that reset IRju is issued, when the HIb pulse occurs, and stays issued until the LOb pulse occurs during when it is released. One such implementation is described below: Internal reset generation circuit 220 comprises of switch SW3, switch SW4, Inverters I4, I5 and I6, an optional synchronous reset circuit 221. Inverter I4's output connects to Inverter I5 and I6's input. I6 is a weak inverter to feed back to its output back to I4 to hold steady I4's input if SW3 and SW4 are open. SW3's one end connects to a high potential source such as supply to signify logic 1, and the other end connects to input of inverter I4. HIb described in above paragraph to signify reset issue, controls and turns SW3 on for the duration of the one-shotted pulse HIb. SW4's one end connects to a low potential source such as ground to signify logic 0, and the other end is tied to input of inverter I4. LOb described in above paragraph to signify reset release, controls and turns SW4 on for the duration of the one-shotted pulse LOb. Inverter I5's output goes as input to Synchronous Reset circuit 221 that in-turn outputs digital reset signal IRju. This is an optional circuit, implemented with standard latching techniques that can be used if the application of the VCO in a PLL/DLL system requires the reset signal to the different blocks in the PLL/DLL system to be synchronous with respect to a reference clock. Thus when HIb is triggered, the IRju goes logic 1, and when LOb is triggered, IRju goes logic 0. To generalize, the polarities can be reversed if the potentials at the ends of switches are reversed.

Charge-down circuit 230 takes IRju and ACNTL as inputs and outputs analog signal ACNTLju. When IRju is issued, the value of ACNTLju (initially having the same value as ACNTL) is made to fall over time until IRju is released. It can typically be implemented with known structures of charge pumps, with the use of capacitors to retain the charged value. Switch SWju connects ACNTLju to the output that goes as ACNTL. IRju controls the switch such that when it is issued, then the switch is closed, else it is open.

Band-select circuit 199 takes inputs IRju and TUNE[1 to x] bits, and outputs TUNE[1 to x]. Assuming a sequential table of frequency bands, and their Tune bit settings, Circuit 199 is a state machine controller, that is implemented such that when reset IRju is issued, the tune bits are changed so as to select the Tune bits[1 to x] corresponding to the next higher band.

Now that the basic building blocks of the structure have been defined, the working of the entire structure is now described, referring FIG. 5. If the VCO system is used in a PLL/DLL system, a starting frequency band and starting Analog control voltage ACNTL need to be initialized. This can be done using the External reset signal ER to set the starting frequency band, using the Band select 199 that selects the appropriate tune bits TUNE[1 to x]. For a given hardware and supply voltage and temperature conditions, let OP1 (in FIG. 5) be the current operating point in a locked system in functional mode in band i. Since the control voltage ACNTL is steady at OP1 in band i, IRjd and IRju have not been issued, hence switches SWjd and SWju are open. Circuit 211a is set to output reference voltage HL. Circuit 211b is set to output reference voltage DL from the RL table 117 with value RL[i, i+1]. Circuit 111a is set to output reference voltage UL from the same RL table 117 with value RL[i,i−1]. Circuit 112a is set to output reference voltage LL. Since ACNTL at OP1 is above LL, comparator 112b's output, hence 113b's output LOa is a logic 0. Hence switch SW2 is open at this time. UL1 could be a high or low depending on whether the OP1's ACNTL value is lower or higher than UL respectively. Since UL1 is not in transition, pulse generator 113a does not trigger any pulse and its output HIa is 0. Now Assume Temperature or Voltage drifts or PLL/DLL reference clock changes push OP1 down to SwP1. ACNTL is now at LL. This triggers comparator 112b to make LL1 transit from 0 to high, which in turn makes pulse generator 113b produce a one-shotted pulse at LOa, This pulse briefly closes switch SW2 feeding a logic1 to inverter I1 input which propagates to optional circuit 121. This makes IRj d go high, signifying reset issue. Even after the pulse at LOa goes away, the reset IRjd is maintained high even though SW1 and SW2 are open, due to inverter feedback using weak inverter I3. The issue of IRjd is now used to set appropriate circuitry in the VCO and PLL/DLL system to put the systems in suspend mode. Charge-up circuit 130 recognizes the IRjd issue and raises ACNTLjd over time, the rate of rise depending on 130's architecture. IRjd's issue triggers band switching in circuit 199, and the tune bits TUNE[1 to x] are now switched to represent the next lower band during the suspend mode. IRjd's issue also closes switch SWjd propagating the raised ACNTLjd back to ACNTL, raising it. This increase of ACNTL continues to happen until its value equals or goes higher than UL. This is detected by Up-comparator 112a that triggers UL1 to go low. This transition is recognized by Pulse generator 113a, generating a one-shotted pulse at HIa. This pulse briefly closes SW1, which is enough to propagate a logic 0 through the I1, I2 inverter chain to optional circuit 121, that makes IRjd go low (let us term this as reset release). Even after HIa pulse goes away making SW1 open, the weak inverter I3 feedback will maintain a low at input of I1, hence maintaining IRjd low. The reset release makes the Charge-up circuit 130 to not increase ACNTLjd anymore, hence maintaining ACNTL at UL. Reset release also opens switch SWjd, and puts the VCO and PLL/DLL in functional mode, in the next lower frequency band. ACNTL is now free to move up or down appropriately in the new band in a direction to make the PLL/DLL lock. The structures of the Jump-down 100 and Jump-up 200, specifically the monitors 110 and 210, and Internal reset generators 120 and 220, are such that IRju and IRjd will never issue at the same time. Thus while the Jump-down 100 and Jump-up 200 are operational during the lower band transition described above, Switch SWju is open during the entire duration of the above events. So structure 200 does not affect the operation of 100 while 100 is working towards switching to a lower band and resetting the control voltage ACNTL to an operational value in the next band. FIG. 5 also shows an illustration the issue and release of IRjd, corresponding to the events of OP1's downward drift resulting in a band switch to a lower band.

Now opposite to the above case, let us consider the upward movement of the operating point OP4 in current band I, referring FIG. 5. For a given hardware and supply voltage and temperature conditions, let OP4 (in FIG. 5) be the current operating point in a locked system in functional mode. Since the control voltage ACNTL is steady at OP4 in band i, IRjd and IRju have not been issued, hence switches SWjd and SWju are open. Circuit 211a is set to output reference voltage HL. Circuit 211b is set to output reference voltage DL from the RL table 117 with value RL[i,i+1]. Circuit 111a is set to output reference voltage UL from the same RL table 117 with value RL[i,i−1]. Circuit 112a is set to output reference voltage LL. Since ACNTL at OP4 is below HL, comparator 212a's output, hence 213b's output HIb is a logic 0. Hence switch SW3 is open at this time. DL1 could be a high or low depending on whether the OP4's ACNTL value is higher or lower than DL respectively. Since DL1 is not in transition, pulse generator 213b does not trigger any pulse and its output LOb is 0. Now assume Temperature or Voltage drifts or PLL/DLL reference clock changes push OP4 up to SwP2. ACNTL is now at HL. This triggers comparator 212a to make HL1 transit from 0 to high, which in turn makes pulse generator 213a produce a one-shotted pulse at HIb, This pulse briefly closes switch SW3 feeding a logic 1 to inverter I4 input which propagates to optional circuit 221 through I5. This makes IRju go high, signifying reset issue. Even after the pulse at HIb goes away, the reset IRju is maintained high even though SW3 and SW4 are open, due to inverter feedback using weak inverter I6. The issue of IRju is now used to set appropriate circuitry in the VCO and PLL/DLL system to put the systems in suspend mode. Charge-up circuit 230 recognizes the IRju issue and reduces ACNTLju over time, the rate of fall depending on 230's architecture. IRju's issue triggers band switching in circuit 199, and the tune bits TUNE[1 to x] are now switched to represent the next higher band during the suspend mode. IRju's issue also closes switch SWju propagating the lowered ACNTLju back to ACNTL, raising it. This lowering of ACNTL continues to happen until its value equals or goes lower than DL. This is detected by comparator 212*b* that triggers DL1 to go low. This transition is recognized by Pulse generator 213*b*, generating a one-shotted pulse at LOb. This pulse briefly closes SW4, which is enough to propagate a logic 0 through the I4, I5 inverter chain to optional circuit 221, that makes IRju go low (let us term this as reset release). Even after LOb pulse goes away making SW4 open, the weak inverter I6 feedback will maintain a low at input of I4, hence maintaining IRju low. The reset release makes the Charge-down circuit 130 to not decrease ACNTLju anymore, hence maintaining ACNTL at DL. Reset release also opens switch SWju, and puts the VCO and PLL/DLL in functional mode, in the next higher frequency band. ACNTL is now free to move up or down appropriately in the new band in a direction to make the PLL/DLL lock. Since IRju and IRjd will never issue at the same time, Switch SWju is open during the entire duration of the above higher band switching events. So structure 100 does not affect the operation of 200 while 200 is working towards switching to a higher band and resetting the control voltage ACNTL to an operational value in the next band.

The same sequence of band switching can be used when the PLL/DLL system utilizing the VCO is powered up in a certain band, and needs to switch one or more bands to achieve the final operating point after when lock is achieved. FIG. 5 also shows an illustration the issue and release of IRju, corresponding to the events of OP4's downward drift resulting in a band switch to a lower band.

An exemplary embodiment has been disclosed above and illustrated in the accompanying drawings. It will be understood by those skilled in the art that various changes, omissions and additions may be made to that which is specifically disclosed herein without departing from the spirit and scope of the present invention.

The flowchart and block diagrams in the Figures illustrate the architecture, functionality, and operation of possible implementations of systems and methods according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A structure for use with a voltage controlled oscillator (VCO) having a plurality of frequency bands, the structure comprising:
   a jump-up structure and a jump-down structure;
   each jump-up and jump-down structure further comprising:
   an analog control signal to adjust a frequency value or a delay value within each frequency band;
   a plurality of digital control signals representing the analog control signal of a current band;
   a feedback loop to control an analog tuning control circuit;
   a monitor structure to detect a switching point for switching to an alternate band;
   a reset generating structure to issue one or more reset signals for suspending the operation of the VCO when the switching point is detected;
   a plurality of initializing structures to raise or lower the analog control signal to a value in a predetermined range;
   a band select structure which uses the reset signals to change the digital control signals to switch to the alternate band;
   a plurality of reset release structures to release the reset signals from the VCO to resume operation after switching to the alternate band when the analog control signal is equal to the value in the predetermined range; and
   a switch structure to couple at least one of the initializing structures to the analog control signal when the reset signal is issued, and to decouple at least one of the initializing structures from the analog control signal when the reset signal is released;
   wherein the jump-up and the jump-down structures detect when the analog control signal has reached a predetermined operational limit in the current band, and generate the reset signals to switch to the alternate band based on a direction of analog control signal movement, and setting a new value for the analog control signal to a predetermined operational limit for the alternate band after the VCO is released to functional mode.

2. The structure according to claim 1, wherein at least one of the jump-up structure or the jump-down structure are coupled to one VCO, the VCO having a predetermined number of frequency bands.

3. The structure of claim 1, wherein the jump-up structure and the jump-down structure are coupled to more than one VCO, each VCO having a predetermined number of frequency bands.

4. The structure according to claim 1, wherein the jump-down structure further comprises:
   a predetermined low value for each frequency band.

5. The structure according to claim 4, wherein the initializing structure changes the value of the analog control signal to that of the predetermined low value for a next lower band when the analog control signal is equal to a predetermined lower operational limit in the current band.

6. The structure according to claim 1, wherein the alternate band has a lower frequency than the current band.

7. The structure according to claim 1, wherein the jump-up structure further comprises:
   a predetermined high value for each frequency band.

8. The structure according to claim 7, wherein the initializing structure changes the value of the analog control signal to correspond to a predetermined high value for a next higher band when the analog control signal is equal to a predetermined higher operational limit in the current band.

9. The structure according to claim 1, wherein the alternate band has a higher frequency than the current band.

10. The structure of claim 8, wherein the monitor structure further comprises:
    a limit determination structure comprising a decoder to decode the digital tuning control signals to identify the current band and next lower band, and a lookup table containing design time predetermined low limits unique to two bands;

an upper limit setter implemented with voltage reference structures to uniquely reflect the table value as a high analog voltage value, unique to current and next lower band;

a lower limit setter implemented with voltage reference structures to reflect a predetermined low analog voltage value;

comparator structures to compare the said high and low analog values to said analog control voltage; and pulse generator structures to generate edge-detecting pulses when said analog control voltage goes below the said low analog voltage value and above the said high analog voltage value.

11. The structure of claim 1, wherein the reset issue and reset release structures further comprise:

switches to detect triggered pulses from the monitor structure to generate the reset signal; and a synchronous reset structure comprising latches to make the reset signal synchronous to a reference clock in the VCO system;

wherein the reset signal issues when the analog control signal equals or goes below a low analog voltage generated in the monitor structure, and the reset signal releases when the analog control voltage equals the high analog voltage generated in the monitor structure.

12. A method of switching between frequency bands on a voltage controlled oscillator (VCO) the steps comprising:

providing a jump-up structure and a jump-down structure;

providing an analog control signal;

providing a feedback loop to control an analog tuning control circuit;

providing a plurality of digital control signals representing the analog control signal of a current band;

adjusting a frequency value or a delay value within each frequency band of the VCO;

providing a monitor structure;

comparing an analog tuning control signal to a predetermined limit;

detecting a switching point for switching to an alternate band;

providing a reset generating structure;

issuing one or more reset signals for suspending the operation of the VCO when the switching point is detected;

providing a plurality of initializing structures for raising or lowering the analog control signal to a value in a predetermined range;

setting an analog control voltage to a value in a predetermined range;

providing a band select structure for changing the digital control signals to switch to the alternate band;

providing a plurality of reset release structures to release the reset signals from the VCO to resume operation after switching to the alternate band when the analog control signal is equal to the value in the predetermined range;

providing a switch structure to couple at least one of the initializing structures to the analog control signal when the reset signal is issued, and to decouple at least one of the initializing structures from the analog control signal when the reset signal is released;

issuing a reset signal to suspend the operation of the VCO when the analog tuning control signal is equal to the predetermined limit;

assigning a new starting value for the analog tuning control signal;

changing the digital tuning controls to the next alternate frequency band; and releasing the VCO to functional mode.

13. The method according to claim 12, wherein the predetermined limit is a low limit.

14. The method of claim 13, wherein the next alternate frequency band is the next lower band.

15. The method according to claim 12, wherein the predetermined limit is a high limit.

16. The method of claim 15, wherein the next alternate frequency band is the next higher band.

* * * * *